United States Patent [19]

Niwayama

[11] Patent Number: 4,797,727

[45] Date of Patent: Jan. 10, 1989

[54] THYRISTOR WITH ALIGNED TRIGGER GUIDE

[75] Inventor: Kazuhiko Niwayama, Hyogo, Japan

[73] Assignee: Mitsubishi Denki Kabushiki Kaisha, Tokyo, Japan

[21] Appl. No.: 521,510

[22] Filed: Aug. 8, 1983

[30] Foreign Application Priority Data

Aug. 12, 1982 [JP] Japan .................. 57-141456

[51] Int. Cl.⁴ ............... H01L 23/42; H01L 23/44; H01L 23/46
[52] U.S. Cl. ............................ 357/79; 357/80
[58] Field of Search ............................ 357/79, 80

[56] References Cited

U.S. PATENT DOCUMENTS 4,466,009  8/1984  Konishi et al. ............ 350/96.21

FOREIGN PATENT DOCUMENTS 0021352  6/1980  European Pat. Off. .
2115954  10/1972  Fed. Rep. of Germany .
2808531  11/1978  Fed. Rep. of Germany .
2719400  11/1978  Fed. Rep. of Germany .
1579619  5/1978  United Kingdom .

OTHER PUBLICATIONS

Application No. 80103426.5; European Patent Appl.; Ohashi et al.; filed 6/19/80; published 1/7/81.

Primary Examiner—William L. Sikes
Assistant Examiner—Robert E. Wise
Attorney, Agent, or Firm—Sughrue, Mion, Zinn, Macpeak & Seas

[57] ABSTRACT

A thyristor comprising a thyristor element with a trigger section 1a formed on the surface thereof. The thyristor element is attached to a metal disk 2 having at least three faces 2a on its periphery which are all a common distance 1 from the center of the trigger section. One electrode unit 4 is attached to the opposing surface of the metal disk and a second electrode unit 3 is attached to the opposing surface of the thyristor element. A trigger signal guide 10 penetrates an insulating tube 5 surrounding the element and one end of the guide is positioned on the central axis of the insulating tube. Positioning members 11 of equal width are compressively inserted between the insulating tube and the faces of the metal disk.

14 Claims, 2 Drawing Sheets

THYRISTOR WITH ALIGNED TRIGGER GUIDE

BACKGROUND OF THE INVENTION

The present invention relates to a thyristor, and more particularly, to a mechanism for accurately positioning its light-sensitive area and trigger guide in registry.

This mechanism is hereunder described with particular reference being made to a light pulse triggered thyristor. A typical example of a conventional light pulse triggered thyristor is shown in cross-section in FIG. 1, wherein a thyristor element 1 has a trigger section or light-receiving area 1a in the center of its upper surface. A reinforcing disk 2 made of a metallic material having a coefficient of thermal expansion close to that of the element 1 is secured to the lower surface thereof. A first electrode unit 3 is pressed against an electrode that is formed to surround the light-receiving area 1a on the upper surface of the element 1. A second electrode unit 4 is pressed against the lower surface of the reinforcing disk 2. An insulating tube 5 for positioning and reinforcing the metal disk 2 is made of a material like alumina ceramic and peripherally surrounds the element 1, the disk 2, and the electrode units 3 and 4. The inside diameter of the insulating tube 5 is slightly larger than the outside diameter of the disk 2. Upper and lower annular metal plate flanges 6 and 7, respectively, are hermetically secured to the upper and lower sides of the insulating tube 5. The inner peripheral surfaces of the flanges 6 and 7 are similarly secured to the outer peripheral surfaces of the electrode units 3 and 4, respectively. A transverse groove 8 is provided in the first electrode unit 3 on the side thereof facing the element 1. Said groove 8 extends radially inward from the outer peripheral surface of the first electrode unit 3 to a point beyond the light-receiving area 1a and is wider in a direction perpendicular to the section of FIG. 1 than the diameter of the light-receiving area 1a. A transverse through-hole 9 is made in an area of the insulating tube 5 corresponding to the groove 8. A light guide 10 for directing external trigger light signals to the light-receiving area 1a comprises a glass rod permitting a high degree of light transmission. The outer peripheral surface of the portion of said guide 10 which is closer to its outside end is sealed to the inner wall of the through-hole 9 so that the inside end of said guide is positioned along the central axis of the insulating tube 5 at a point close to the light-receiving area 1a. Said outside end passes through the transverse groove 8 and the through-hole 9 to extend outside of the insulating tube 5.

In the apparatus of FIG. 1, the outer peripheral surface of the portion of the light guide 10 which is closer to its outside end is sealed to the inner wall of the through-hole 9 in the insulating tube 5 so that the inside end of the guide 10 is positioned along the central axis of the insulating tube 5. The reinforcing metal disk 2 is held in position by being pressed into the insulating tube 5. Therefore, in order for both the inside end of the light guide 10 and the light-receiving area 1a of the element 1 that is secured to the upper surface of the metal disk 2 to be positioned along the central axis of the insulating tube 5, the element 1 must be fixed to the upper surface of the metal disk 2 so that the center of the light-receiving area 1a is positioned on the line that is normal to the center of said upper surface of the metal disk 2. But this is very difficult to achieve and it sometimes occurs that the center of the light-receiving area 1a is not in registry with the line that is normal to the center of the upper surface of the metal disk 2. If this misalignment occurs, the inside end of the light guide 10 becomes offset with respect to the center of the light-receiving area 1a and the amount of light being transmitted from the inside end of the light guide 10 toward the light-receiving area 1a is not sufficient to retain the desired high sensitivity of triggering by light pulses.

SUMMARY

Therefore, the primary object of the present invention is to provide a light pulse triggered thyristor that will not experience a reduction in trigger sensitivity.

This object can be achieved by using a mechanism that ensures the positioning of the trigger section or light-receiving area of the thyristor element that receives the trigger signals in registry with one end of the trigger signal guide which contacts or is in close proximity to the trigger section.

DETAILED DESCRIPTION OF THE PREFERRED EMBODIMENT

Figure 1:
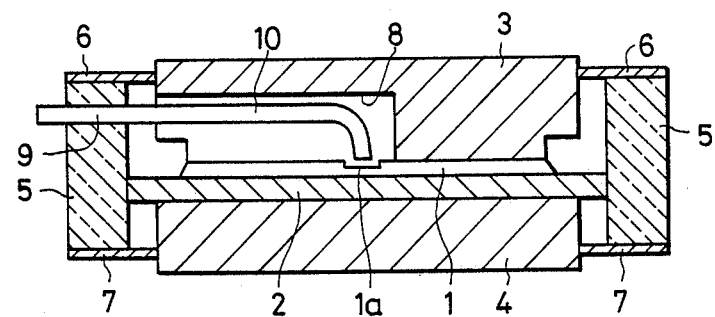
FIG. 1 is a cross-section showing an example of the conventional prior art light pulse triggered thyristor.
Figure 2:
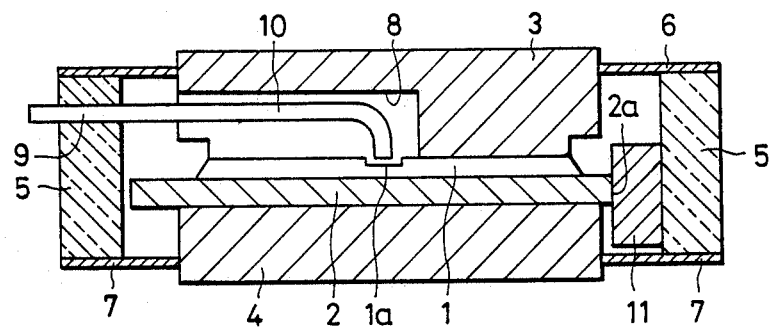
FIG. 2 is a cross-section showing a light pulse triggered thyristor according to one embodiment of the present invention.
Figure 3:
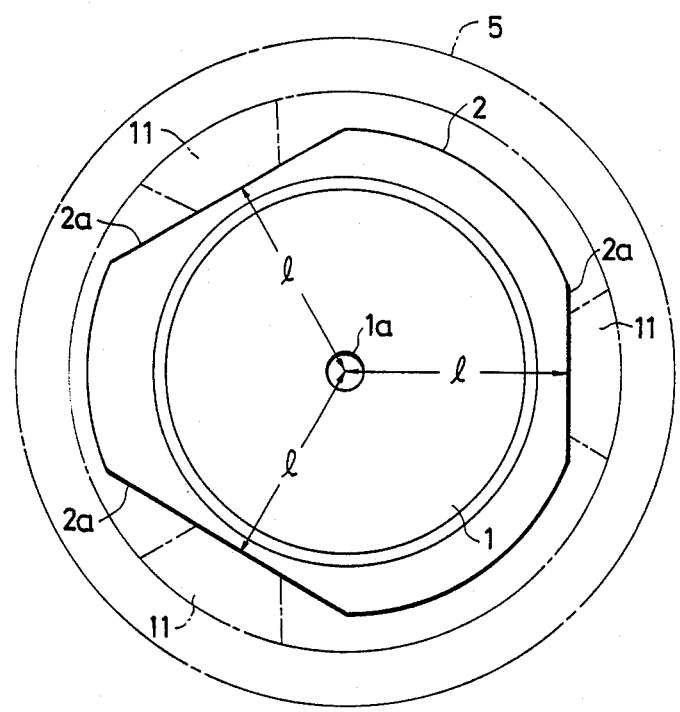
FIG. 3 is an plan view of the embodiment of FIG. 2.

A cross-section of a light pulse triggered thyristor according to one embodiment of the present invention is shown in FIG. 2, wherein the same components as shown in FIG. 1 are identified by like numerals. In the embodiment of FIG. 2, the inside diameter of the insulating tube 5 is sufficiently larger than the outside diameter of the reinforcing metal disk 2 to permit some degree of movement of the disk within the insulating tube 5 in a direction perpendicular to its axis. As shown in the plan view of FIG. 3, the periphery of the metal disk 2 in an area onto which the element 1 is not attached is configured with three faces 2a that are spaced apart by an angle of 120° and which are cut such that they are separated from the center of the light-receiving area 1a by a given distance l. The embodiment of FIGS. 2 and 3 also includes three positioning members 11, each of which is made of insulating board. The three positioning members 11 hold the metal disk 2 in position by compressing its cut faces 2a. As indicated in FIG. 3, one principal surface of each positioning member 11 is bonded to that part of the inner peripheral surface of the insulating tube 5 which is opposite the cut face 2a. The distance between the other principal surface of the positioning member 11 and the central axis of the insulating tube 5 is slightly smaller than l, the distance between the cut face 2a and the center of the light-receiving area 1a.

According to the illustrated embodiment in FIGS. 2 and 3, the center of the light-receiving area 1a can be put into registry with the axis of the insulating tube 5 by fitting the reinforcing metal disk into the tube in such a manner that the cut faces 2a of the disk 2 are in close or tight, i.e., compressive contact with the respective positioning members 11. On the other hand, the outside end of the light guide 10 is fixed to the insulating tube 5 so that the inside end that transmits light signals to the light-receiving area 1a is positioned on the central axis of the insulating tube 5. Therefore, no misalignment will occur between the inside end of the light guide 10 and the light-receiving area 1a. Accordingly, the thyristor remains highly sensitive to triggering by light pulses.

It will be noted that proper registry is achieved in FIG. 3 even though the element 1 is not coaxially mounted on the disk 2, i.e., the center of the light-receiving area 1a is not coincident with the axis of the disk 2. This is readily seen by the right-most cut face 2a being shorter than the other two faces.

In the illustrated embodiment, the metal disk 2 is provided with three cut faces 2a on its periphery, but it should be understood that more cut faces may be provided. It is also possible to provide cut faces along the entire periphery of the disk 2. In the embodiment shown, the positioning members 11 are bonded to the inner peripheral surface of the insulating tube 5, but they may be formed as an integral part of the insulating tube 5. Alternatively, they may be simply inserted between the cut faces 2a and the inner surface of the tube 5. The positioning members 11 need not be made of insulating board, but instead may be formed from a metal plate. Said members 11 also need not be in the form of a plate but they may assume any form such that the thickest part is slightly wider than the difference between the radius of the inner circumference of the insulating tube and the distance l between each cut face 2a and the center of the light-receiving area 1a.

The foregoing description concerns a light pulse triggered thyristor, but it should be understood that the concept of the present invention is also applicable to other types of thyristors which have a gate electrode in the center of one principal surface and have the other principal surface secured to a reinforcing metal disk.

As described above, the thyristor of the present invention has cut faces provided in at least three spaced areas covering more than half of the disk periphery to which the thyristor's element is not affixed. The cut faces are given a smooth face that is spaced from the center of the trigger section by a predetermined distance. The metal disk is compressively held in position within the insulating tube by inserting, between the inner peripheral surface of the insulating tube and said cut faces, positioning members each having a form such that the thickest part is slightly wider than the difference between the radius of the inner circumference of the insulating tube and the distance between each cut face and the center of the trigger section. Because of this arrangement, the trigger section of the thyristor's element can be positioned on the central axis of the insulating tube. Since that end of the light guide which directs trigger signals toward the trigger section is also positioned on the axis of the insulating tube, ther will be no misalignment between the end of the guide for trigger signals and the trigger section of the thyristor's element, and as a result, high trigger sensitivity is assured.

I claim:

1. A thyristor, comprising:
   a thyristor element having a first electrode and a trigger section (1a) formed in the center of one principal surface thereof for receiving trigger signals;
   a reinforcing metal disk (2), the first principal surface of which is secured to the other principal surface of said element thereby forming a second electrode, the periphery of said disk being unsecured to said element and comprising at least three faces (2a) spaced from the center of said trigger section by a predetermined distance;
   a first electrode unit (3) connected to the first electrode formed on said one principal surface of the element;
   a second electrode unit (4) connected to the second principal surface of said reinforcing metal disk;
   an insulating tube (5) surrounding said element;
   a trigger signal guide (10) in the form of a rod for directing trigger signals to said trigger section, one end of said signal guide being adjacent to said trigger section and the other end of which penetrates said insulating tube and is fixed thereto; and
   positioning members (11) that abut the faces on said reinforcing metal disk for positioning said metal disk within said insulating tube,
   wherein said positioning members each have a form such that the thickest part is slightly wider than a difference between the radius of the inner circumference of the insulating tube and a distance between each cut face and the center of the trigger section.

2. A thyristor, as recited in claim 1, wherein said positioning members form an integral part of said insulating tube.

3. A thyristor, as recited in claim 1, wherein said reinforcing metal disk comprises three faces which are spaced from each other by an angle of 120°.

4. A thyristor, as recited in claim 3, wherein said faces are obtained by cutting.

5. A thyristor, as recited in claim 1, wherein:
   said reinforcing metal disk is made of a metallic material having a coefficient of thermal expansion close to that of the thyristor element;
   said first electrode is formed around the trigger section;
   said first electrode unit has a transverse groove (8) provided in the side facing the element, said groove extending radially from the outer peripheral surface of the first electrode unit to a point therein beyond said trigger section and being wider than the diameter of said trigger section;
   said trigger signal guide is disposed within said transverse groove;
   said first electrode unit is in compression against said first electrode;
   said second electrode unit is in compression against the second principal surface of said reinforcing metal disk;
   said first and second electrode units are hermetically sealed to both sides of said insulating tube; and
   said trigger signal guide is hermetically sealed to said reinforcing metal disk.

6. A thyristor, as recited in claim 5, wherein said trigger signal guide is a light guide and the trigger section is a light-receiving area.

7. A thyristor as recited in claim 5, wherein said trigger signal guide is a gate lead and said trigger section is a gate electode.

8. A thyristor, comprising:
   a thyristor element, having a trigger section and a first electrode formed therearound formed in the center of one principal surface of the element for receiving trigger signals;
   a reinforcing metal disk made of a metallic material having a coefficient of thermal expansion close to that of said element, the first principal surface of said disk being secured to the other principal surface of said element for forming a second electrode and the periphery of said disk being unsecured to said element, said disk comprising at least three faces that are spaced from the center of said trigger section by a predetermined distance;

a first electrode unit in compression against said first electrode;

a second electrode unit in compression against the second principal surface of said reinforcing metal disk;

an insulating tube that surrounds said element, said first and said second electrodes, both sides of said tube being hermetically sealed to said first and second electrode units;

a trigger signal guide in the form of a rod for directing trigger signals to said trigger section, one end of said signal guide being positioned on the central axis of said insulating tube and adjacent to said trigger section and the other end thereof passing through said insulating tube and being hermetically sealed thereto; and positioning members, the thickest parts of which are slightly wider than the difference between the radius of an inner circumference of said insulating tube and the predetermined distance between each of said faces and the center of said trigger section, said positioning members being compressively inserted between the inner peripheral surface of said insulating tube and said faces for positioning said metal disk within said insulating tube.

9. A thyristor, as recited in claim 8, wherein said positioning members form an integral part of said insulating tube.

10. A thyristor, as recited in claim 8, wherein said reinforcing metal disk is provided with three faces which are spaced apart by an angle of 120°.

11. A thyristor, as recited in claim 10, wherein said faces are obtained by cutting.

12. A thyristor, as recited in claim 8, wherein said first electrode unit has a transverse groove provided in the side thereof facing the element, said groove extending radially from the outer peripheral surface of the first electrode unit to a point thereof beyond said trigger section and being wider than the diameter of said trigger section, said trigger signal guide being disposed within said transverse groove.

13. A thyristor, as recited in claim 12, wherein said trigger signal guide is a light guide and the trigger section is a light-receiving area.

14. A thyristor, as recited in claim 12, wherein said trigger signal guide is a gate lead and said trigger section is a gate electrode.

* * * * *